United States Patent
Suenaga et al.

(10) Patent No.: US 7,771,625 B2
(45) Date of Patent: Aug. 10, 2010

(54) METHOD FOR PRODUCING SURFACE-TREATED SILVER-CONTAINING POWDER AND SILVER PASTE USING SURFACE-TREATED SILVER-CONTAINING POWDER

(75) Inventors: Wataru Suenaga, Ageo (JP); Youji Nakaya, Kitakatsushika-gun (JP)

(73) Assignee: Dainippon Ink and Chemicals, inc., Tokyo (JP)

( * ) Notice: Subject to any disclaimer, the term of this patent is extended or adjusted under 35 U.S.C. 154(b) by 384 days.

(21) Appl. No.: 11/719,602

(22) PCT Filed: Nov. 25, 2005

(86) PCT No.: PCT/JP2005/021707

§ 371 (c)(1), (2), (4) Date: May 17, 2007

(87) PCT Pub. No.: WO2006/057348

PCT Pub. Date: Jun. 1, 2006

(65) Prior Publication Data

US 2009/0146117 A1    Jun. 11, 2009

(30) Foreign Application Priority Data

Nov. 29, 2004 (JP) .............. 2004-343880
Sep. 6, 2005 (JP) .............. 2005-257667

(51) Int. Cl.
H01B 1/02 (2006.01)
H01B 1/22 (2006.01)

(52) U.S. Cl. .......... 252/514; 75/370; 427/216; 428/403

(58) Field of Classification Search .......... 252/512; 75/370; 427/216; 428/403
See application file for complete search history.

(56) References Cited

U.S. PATENT DOCUMENTS 4,979,985 A * 12/1990 Tosun et al. .......... 75/370

(Continued)

FOREIGN PATENT DOCUMENTS

EP    1 339 073 A1    8/2003

(Continued)

OTHER PUBLICATIONS

International Search Report of PCT/JP2005/021707, date of mailing Feb. 14, 2006.

(Continued)

Primary Examiner—Mark Kopec
Assistant Examiner—Khanh Tuan Nguyen
(74) Attorney, Agent, or Firm—Westerman, Hattori, Daniels & Adrian, LLP

(57) ABSTRACT

A method for producing a surface-treated silver-containing powder comprises vacuum freeze drying a dispersion liquid, which is obtained by dispersing silver or silver compound particles (a) in a solvent together with a surfactant (b) of an alkylamine type or an alkylamine salt type, or a phosphate type having a phosphorus content of 0.5 to 10% by mass so that the surfactant (b) is adsorbed in the surface of the silver or silver compound particles (a), thereby producing a silver-containing powder (c) whose surface is treated with the surfactant (b). Moreover, a silver paste is produced by dispersing the surface-treated silver-containing powder (c) in a solvent, or in a solvent with a resin.

4 Claims, 5 Drawing Sheets

U.S. PATENT DOCUMENTS

| | | | |
|---|---|---|---|
| 5,188,660 A | 2/1993 | Tosun et al. | |
| 5,372,749 A * | 12/1994 | Li et al. | 252/512 |
| 6,582,763 B1 * | 6/2003 | Nishimura et al. | 427/216 |
| 6,686,045 B2 * | 2/2004 | Takai et al. | 428/403 |
| 2002/0146564 A1 * | 10/2002 | Takai et al. | 428/403 |

FOREIGN PATENT DOCUMENTS

| | | | |
|---|---|---|---|
| JP | 57-21001 A | | 5/1982 |
| JP | 02-307202 A | | 12/1990 |
| JP | 2000-231828 A | | 8/2000 |
| JP | 2000-234107 A | | 8/2000 |
| JP | 2002-167603 A | | 6/2002 |
| JP | 2003-309337 A | | 10/2003 |
| JP | 2004-6502 A | | 1/2004 |
| JP | 2004-6776 A | | 1/2004 |
| JP | 2004-143546 | * | 5/2004 |
| JP | 2004-143546 A | | 5/2004 |
| JP | 2004-143563 A | | 5/2004 |
| JP | 2004-183009 A | | 7/2004 |
| JP | 2004-273205 A | | 9/2004 |
| JP | 2005-97643 A | | 4/2005 |
| JP | 2005-113177 A | | 4/2005 |
| WO | 2003-032087 A2 | | 4/2003 |

OTHER PUBLICATIONS

Korean Office Action dated Sep. 11, 2008 (mailing date), issued in corresponding Korean Patent Application No. 10-2007-7011805.

European Search Report dated Jun. 30, 2009 issued in corresponding European patent Application No. 05809753.6—2122/1825940 PCT/JP2005021707.

Japanese Office Action, issued Jun. 1, 2010 for corresponding Japanese Patent Application No. 2006-547865.

* cited by examiner

METHOD FOR PRODUCING SURFACE-TREATED SILVER-CONTAINING POWDER AND SILVER PASTE USING SURFACE-TREATED SILVER-CONTAINING POWDER

TECHNICAL FIELD

The present invention relates to a method for producing a surface-treated silver-containing powder for a silver paste that can be utilized for a printed wiring used for electronic equipment or the like, and is superior in conductivity and printing precision. More specifically, the present invention relates to a silver paste containing the surface-treated silver-containing powder as a conductive powder component.

In the present invention, the "surface-treated silver-containing powder" refers to "surface-treated silver powder" and "surface-treated silver compound powder" inclusively.

BACKGROUND ART

A conductive paste means a paste containing conductive fine particles in the solid component. Generally, for the conductive particles, metals such as gold, platinum, silver, and palladium which are not oxidized in the air are used. Conventionally, the conductive paste is largely classified into (1) high-temperature baking conductive paste which can realize a satisfactory conductivity by fusing silver particles, whereas the base material is limited to ceramics or the like, and (2) polymeric conductive paste which can be applied to a wide range from glass and epoxy printed boards to films, whereas the electrical resistance is relatively high so as to obtain conduction by means of contact between metal particles due to heat shrinkage at the time of curing a binder.

When such a polymeric conductive paste is used to form, for example, a conductive circuit on a flexible backing for a printed board, the polymeric conductive paste is used to form a conductive circuit pattern on a plastic film such as polyethylene terephthalate or polyimide by screen printing or the like, followed by heating and curing a binder in the formed pattern coating film, so as to improve the conductivity and the durability, and to ensure the adhesiveness onto the film.

In particular, the polymeric conductive paste using silver or a silver compound is used for forming various wirings in or between electronic parts, and electronic circuit patterns, since a stable conductivity is readily realized and the heat conduction characteristic is also satisfactory.

In a step for printing conductive circuit patterns, involved in the miniaturization of circuits, the printing precision is required to be increased as high as possible, while the precision is limited by the average particle diameter of the conductive particles. Therefore, in order to obtain a satisfactory printing precision, the conductive particles in the conductive paste are required to be in a state where they are dispersed into primary particles, and further the primary particles are completely coated with a resin or the like, that is, a highly dispersed state.

If the coating of the resin or the like around the highly dispersed primary particles is insufficient, the activity of the particles is increased as the particle diameter gets smaller. Therefore, the particles in the conductive paste are aggregated, the viscosity easily rises over time, and in an extreme case, gelation occurs.

In this manner, in order to precisely and stably form fine wiring patterns, the conductive particles are required to be stably dispersed into primary particles, and moreover each particle is required to be coated with a resin. On the other hand, if the resin coating around the conductive particles is too thick, resin components remaining between the particles interfere with the electrical conduction between particles, and thus a satisfactory conductivity is prone to be unobtainable. That proneness becomes more remarkable as the particle diameter of the conductive particles to be used gets smaller.

Consequently, the amount of resin used for dispersion and coating over the surface of the conductive particles is preferably necessarily a minimum. Preferably, the dispersibility of conductive particles, the adhesiveness of conductive paste to the base material, and the film forming property thereof become satisfactory with less amount of resin.

Conventionally, in production of a paste by dispersing conductive particles in a resin, in order to improve the dispersibility, various dispersants are used, which include nonionic dispersants such as ethylene oxide or propylene oxide-added ester compounds of higher fatty acids, sorbitan fatty acid ester compounds, ethylene oxide or propylene oxide-added ether compounds of polyhydric alcohols such as sorbitan, or ethylene oxide or propylene oxide-adducts of alkylbenzenes; anionic dispersants such as alkali salts of alkylbenzene sulfonic acids, alkali salts of higher alcohol sulfate esters, phosphate ester compounds, higher fatty acids, or ethylene oxide or propylene oxide-added sulfate alkali salts of higher fatty acids; and cationic dispersants such as quaternary ammonium salt type.

However, even if these dispersants are used, in a conventional method, for example, a method of dispersing conductive particles in a resin using a disperser or a kneader, the dispersibility of the conductive particles has not been able to be sufficiently improved, and the conductivity of conductive paste has not been able to be kept satisfactory.

In particular, in the case of a silver paste using silver particles as conductive particles, the true specific gravity of the silver particles is 10.5, and the silver particles are easily sedimented with a high reaggregability. Therefore, there is a problem in that time and effort are required for a redispersing step for use after a long term preservation. Consequently, long term preservation stability and satisfactory redispersibility have been demanded.

In response to these problems, an attempt has been made to obtain satisfactory dispersibility and stability over time by using an organic vehicle and an anionic surfactant formed of a sulfosuccinate containing an alkyl group (see Patent Document 1). However, mere usage of this method described in Patent Document 1 is not enough to improve the redispersibility of the sedimented particles. Furthermore, when the line width of the conductive circuit is narrow, it is not enough to precisely print the wiring pattern.

Moreover, the amount of resin used for dispersion is not reduced to the necessarily minimum, and thus it is not enough in terms of the conductivity, either.

On the other hand, in production of a dispersion liquid using metal particles, a vacuum freeze drying method is used. For example, in production of a tantalum powder coating material for producing anode elements for electrolytic capacitors, a method is known in which a tantalum powder and a dispersant are mixed in a solvent, and vacuum freeze drying is performed to adsorb the dispersant into the surface of the tantalum particles (see Patent Document 2).

However, even when being similarly to a metal dispersion liquid, there is no example in which vacuum freeze drying is applied to the production of a conductive paste having greatly different usage and greatly different required characteristics, and the relationship between the dispersibility and the conductivity has not been suggested. Still more, selection of a dispersant for realizing a satisfactory conductivity is not disclosed at all.

As above, in order to sufficiently bring out the characteristics of a conventional polymeric conductive paste, application of an optimum dispersion method and selection of a dispersant suitable for the dispersion method are important, and the dispersant for realizing a satisfactory conductivity of the conductive paste and the dispersion method thereof have been demanded.

In particular, recently, in order to reduce the electrical resistance of a conductive circuit formed from a conductive paste, it is discussed to use a silver paste capable of low-temperature baking by highly miniaturizing the diameter of silver particles, or using a particulate silver compound containing a particulate silver oxide or a tertiary fatty acid silver salt. In this low-temperature baking silver paste, in the case of the finely particulated silver particles, adjacent particles are fused by heating at 300° C. or less so as to reduce the electrical resistance of the conductive circuit. Moreover, in the case of the particulate silver compound, the silver compound is reduced to become a silver-metal, by heating at 300° C. or less or heating under the presence of a reductant, and adjacent silver particles are fused so as to reduce the electrical resistance of the conductive circuit (for example, see Patent Document 3).

Conventionally, a polymeric conductive paste is obtained by adding a binder formed from an acrylic resin, an epoxy resin, a polyurethane resin, a polyester resin, or the like, an organic solvent, a curing agent, a catalyst, and the like, and dispersing and mixing globular or flaky conductive particles therein. The conductivity is obtained by a contact between the conductive particles due to curing shrinkage when the binder is cured. Therefore, the electrical resistance becomes relatively high, and the cohesive power of the cured resin is changed due to the temperature change or the like, thus accompanied by a drawback in that the electrical resistance of a conductive circuit, which is formed by using such a polymeric conductive paste or the like, is easily changed.

The low-temperature baking silver paste compensates for such a drawback. By using this silver paste, a conductive circuit having a satisfactory conductivity can be formed on a plastic film such as PET.

However, such silver particles which are microparticulated into submicrons or less, or particulate silver compound to be used for a low-temperature baking silver paste, have a high reactivity, and are both difficult to handle in a dried powder state. In particular, the particulate silver compound is very high in the speed of reduction reaction, and thus has to be preserved in a solution such as water or a low-reducibility solvent. In particular, if an alcohol solvent or the like is used for the dispersion solvent, reduction progresses during the dispersion of the silver paste, and instead of dispersion, fusion might occur between the silver particles. Therefore, it is further demanded to disperse these silver or silver compound particles into primary particles, and to coat the surface of each particle for stabilization.

Furthermore, in order to obtain an inherent high electrical conductivity in such silver paste, the silver particles in the silver paste have to be satisfactorily dispersed while keeping a high silver content. In addition, the stabilization has to be performed by a necessarily minimum amount of resin, to thin the coating film thickness on the surface of the particle as much as possible, so that the adjacent particles are readily fused by low-temperature baking. If the coating film formed on the surface of the silver or silver compound particles is too thick, it is difficult for the adjacent particles to be fused, and the packing density of the silver or silver compound is decreased, thus the inherent merit of such low-temperature baking silver pastes can not be obtained, which provides a satisfactory conductivity even in low-temperature baking.

Therefore, with respect to these low-temperature baking silver pastes, selection of a dispersant which concurrently satisfies the stabilization by means of coating individual silver or silver compound particles, the improvement of dispersibility, and the improvement of conductivity by means of low-temperature baking, and a method for producing thereof are even more important.

[Patent Document 1] Japanese Unexamined Patent Application, First Publication No. 2000-231828

[Patent Document 2] Japanese Unexamined Patent Application, First Publication No. 2004-006502

[Patent Document 3] Japanese Unexamined Patent Application, First Publication No. 2003-309337

DISCLOSURE OF INVENTION

An object of the present invention is to provide a silver paste in which silver or silver compound particles having a fine particle diameter are satisfactorily dispersed, which is not changed in physical properties over time such as viscosity rise, and is capable of forming a conductive circuit having a satisfactory conductivity with a thin line width.

Moreover, another object of the present invention is to provide a method of producing a surface-treated silver-containing powder which is essential for producing the silver paste.

Furthermore, yet another object of the present invention is to provide a silver paste capable of low-temperature baking and capable of forming a coating film having a high conductivity after baking, by using silver or silver compound particles having a low sinterable temperature.

The present invention provides a method for producing a surface-treated silver-containing powder including a drying step of vacuum freeze drying a dispersion liquid, which is obtained by dispersing silver or silver compound particles in a dispersing solvent together with a surfactant of an alkylamine type or alkylamine salt type, or a phosphate type surfactant having a phosphorus content of 0.5 to 10% by mass.

Furthermore, the present invention provides a silver paste containing the surface-treated silver-containing powder and a resin.

By using the method for producing a surface-treated silver-containing powder of the present invention, silver or silver compound particles are finely particulated and dispersed, and a surfactant is adsorbed in the surface of each particle of the silver or silver compound, to satisfactorily coat the particle surface.

Typically, in a normal treatment method, metal particles having a high specific gravity such as silver are easily sedimented and the concentration distribution easily occurs in a disperser, and thus it is difficult to perform a uniform treatment. However, using the method of the present invention, by dispersing in a solvent containing a surfactant and then performing vacuum freeze drying, the surface of the silver or silver compound particles can be treated in a more uniform treatment condition.

Furthermore, in the present invention, since the surface treatment is performed using a surfactant of an alkylamine type or alkylamine salt type, or a phosphate type surfactant having a phosphorus content of 0.5 to 10% by mass, the surfactant is extremely satisfactorily adsorbed into the surface of the silver or silver compound particles, and the dispersibility is improved.

Using such a silver-containing powder whose particle surface is treated with a surfactant, a silver paste having a wide range of viscosity can be produced merely by mixing and stirring, or by a simple dispersion operation, where a solvent, or a resin with a solvent are added. Furthermore, since the surface of the particles formed of a silver or silver compound is already treated with a surfactant, then the particles formed of the silver or silver compound can be satisfactorily dispersed in the silver paste. Moreover, the addition of resin as a dispersant can be suppressed to a low level, compared to the case where untreated metal particles are dispersed. Since the resin coating amount on the particle surface is not increased, the conductivity when the conductive paste is formed is not reduced. As a result, the blending ratio of the silver or silver compound particles can be increased, which is also effective to improve the conductivity. Since the silver or silver compound particles are satisfactorily and finely dispersed in a solvent together with a binder resin, a silver paste having superior characteristics can be produced.

In a conventional method where the paste viscosity is defined by the disperser used, the paste viscosity after dispersion is usually readjusted to an optimum viscosity that matches with each of the printing methods. For example, in some cases, in order to set a high viscosity which is optimum for the screen printing method, the amount of solvent in the paste has to be reduced by means of vaporization or the like, after dispersion.

However, if the surface of silver particles as above is treated using a surfactant of an alkylamine type, phosphate type, or the like, the paste can be formed merely by mixing and stirring with a resin and a solvent for forming a paste. As a result, it becomes possible to readily produce a silver paste having the most optimum silver powder content and viscosity for a printing method used for producing conductive circuits.

The silver paste of the present invention is readily stabilized by redispersion to a certain degree of stirring, even if the paste is left for a long time after production, and thus long term preservation is possible. Moreover, preservation in the state of the surface-treated silver-containing powder produced by the production method of the present invention, is also possible, so that only a necessary amount of silver paste need be produced as required.

Figure 1:
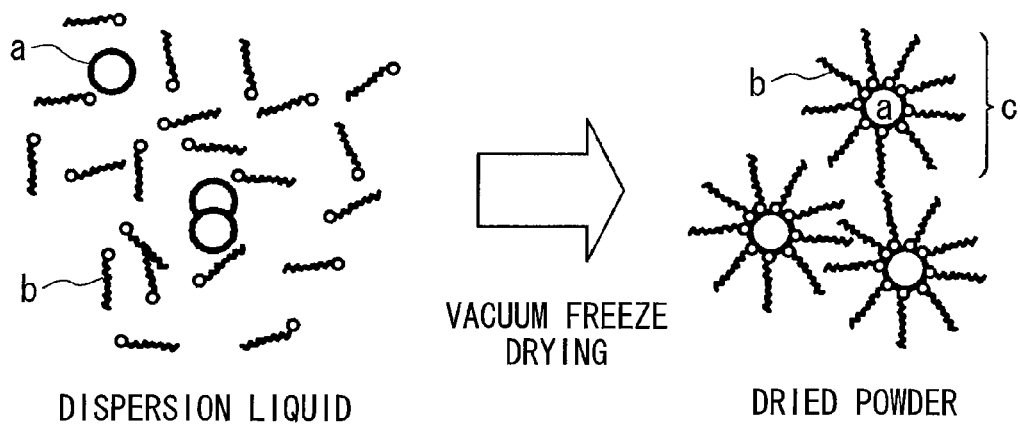
FIG. 1 is an explanatory diagram schematically illustrating the surface treatment method of a silver powder with a surfactant according to the present invention.

The reference numerals shown in these figures are defined as follows:

a represents silver or silver compound powder (particle);

b represents surfactant (molecule); and c represents surface-treated silver-containing powder (particle).

BEST MODE FOR CARRYING OUT THE INVENTION

Hereunder is a more detailed description of the present invention. In the present invention, "sintering of silver or silver compound particles" means to melt and fuse silver or silver compound particles with each other by heating a substance (such as a powder or paste) containing the silver or silver compound particles. Moreover, "baking of a silver paste" means to bring the adjacent silver or silver compound particles into contact with each other, or to fuse the contact part by heating a silver paste so as to cure and shrink a contained resin. Furthermore, "dispersion" means a phenomenon where a continuous phase has another phase scattered in a fine particle form therein.

By using a silver-containing powder having surface-treated silver or silver compound particles according to the present invention, a silver paste having superior dispersibility and a satisfactory conductivity can be produced. In particular, if silver or silver compound particles having a low sintering temperature, such as silver or silver compound particles having a ultrafine particle diameter, silver or silver compound particles having a low crystallinity (a small crystallite diameter), and silver oxide-treated silver particles, are applied, then a silver paste bakable at a much lower temperature (having a lower bakable temperature) than that of a conventional high-temperature baking conductive paste, and capable of forming wiring patterns having a satisfactory conductivity after baking, can be obtained.

As to the silver particles used in the present invention, pure silver particles, silver surface-coated metal particles, or a mixture thereof may be used. As to the silver particles, any particle shape may be used such as a globular shape, a scale shape, a needle shape, and a dendritic shape. The method for producing the silver particles is not particularly limited, and may be any method such as mechanical comminution method, a reduction method, an electrolytic method, and a gas phase method. The silver surface-coated metal particles mean particles formed from a non-silver metal whose surface is formed with a silver coating layer by a method such as plating. For example, copper particles whose surface is coated with silver are commercially available. As to the silver particles, from the viewpoint of conductivity and cost, globular silver particles or scale shaped silver particles solely formed from silver are preferred.

The volume average particle diameter of such globular silver particles is preferably about 0.05 to 10 μm, and more preferably 0.05 to 5 μm. In the case of scale shaped silver particles, the major axis diameter of the scale surface is preferably within a range of 0.05 to 100 μm.

As to the silver particles, two or more types of large and small particles having different volume average particle diameters may be combined to increase the packing density of the silver particles, and thereby to improve the conductivity of the conductive film.

As to the silver compound particles, particles of a silver-containing organic compound such as silver oxide, aliphatic silver carboxylate, alicyclic silver carboxylate, and aromatic silver carboxylate may be used. Regarding these silver compound particles (particulate silver compound), industrial products may be used, as well as those obtained by a reaction from an aqueous solution containing a silver compound. In particular, it is preferable to use silver compound particles having an average particle diameter of 0.5 µm or less, since the speed of the reductive reaction is accelerated. The silver compound particles having an average particle diameter of 0.5 µm or less can be produced by a method in which an alkali aqueous solution such as sodium hydroxide is added dropwise to a product generated by a reaction between a silver compound and another compound, such as a silver nitrate aqueous solution, under stirring, to promote a reaction, so as to obtain silver oxide particles.

In the production method of the present invention, when a silver paste is produced, it is preferable to use silver or silver compound particles such that the baking temperature, at which the silver particles are fused by heating the silver paste, can be set to 300° C. or less. With a low-temperature baking silver paste having such a low baking temperature, for example, a wiring pattern formed on a polyimide film or a PET film, can be baked as it is. Generally, as conductive particles are more finely dispersed in a conductive paste, the heat capacity of the conductive paste is decreased, and the baking temperature of the conductive paste gets closer to the sintering temperature peculiar to the conductive particles themselves. Furthermore, as the conductive particles are more finely dispersed, the packing density thereof is increased, and thus generally the conductivity after baking is improved as they are highly dispersed.

Moreover, in the silver paste using the surface-treated silver-containing powder according to the production method of the present invention, since the resin component can be reduced, and the film thickness of the resin coating the silver or silver compound particles is thin, the adjacent silver or silver compound particles are readily fused with each other after baking. As a result, when low-temperature baking silver or silver compound particles having a sintering temperature of 300° C. or less are used as the silver or silver compound particles to be offered up for surface treatment with a surfactant, even after the surface treatment with the surfactant, the inherent low-temperature baking property can be sufficiently demonstrated to obtain a low-temperature baking silver paste, and a wiring pattern having a satisfactory conductivity can be obtained as a silver paste after baking.

As to the silver particles having a low sintering temperature, silver particles having a volume average particle diameter of 0.05 to 10 µm may be used. It is further preferable to use silver particles having a volume average particle diameter of 0.05 to 5 µm. In the surface treatment method according to the present invention, if silver particles or silver compound particles are produced in a liquid phase, these particles having a small volume average particle diameter and a high activity can be effectively surface-treated, and furthermore the silver or silver compound particles can be surface-treated under the presence of a surfactant, in a state where these particles are dispersed in the liquid phase as they were at the time of production thereof. Therefore, the treatment is easy and the inherent characteristic of these particles having a low sintering temperature can be sufficiently demonstrated. Examples of the method for producing silver fine particles include an evaporation method in gas (Japanese Unexamined Patent Application, First Publication No. H03-34211) and a reduction deposition method using an amine compound for reduction (Japanese Unexamined Patent Application, First Publication No. H11-319538).

Furthermore, as to the silver particles having a low sintering temperature, silver particles having a low crystallinity may be used. If the crystallinity of the silver particles is low, normally the crystallite diameter decreases. As a result, by decreasing the crystallite diameter, the fusing temperature (sintering temperature) between the silver particles can be remarkably decreased. In order to decrease the bakable temperature of silver paste to 300° C. or less, the crystallite diameter is preferably set to 0.1 to 20 nm, and more preferably 0.1 to 10 µm.

Moreover, as to the silver or silver compound particles having a low sintering temperature, silver particles having a part of the particles treated with silver oxide may be used. The silver oxide-treated silver particles can be obtained by a method of coating and forming a silver oxide layer on the surface of the silver particles, in addition to a method of oxidizing the surface of the silver particles from silver into silver oxide by a partial oxidization treatment of the surface of the silver particles.

By oxidation of the surface of the silver particles, silver on the surface of the particles is oxidized into monovalent silver (1) oxide, divalent silver (2) oxide, and the like. In the silver particles whose surface is coated with silver oxide, the silver oxide on the particle surface may be in a mixed state of silver (1) oxide, silver (2) oxide, and the like. In these silver particles whose surface is coated with silver oxide, the silver oxide in the outer layer becomes silver by a reductive reaction under the presence or absence of a reductant, and the adjacent particles are fused with each other at a low temperature. Regarding the silver oxide surface-treated silver particles, those having a different composition or shape may be appropriately selected according to the conditions of the reductive reaction such as the heating temperature, presence or absence of a reductant, reducing power of the reductant, or the like. The volume average particle diameter of the silver oxide surface-treated silver particles is preferably about 0.05 to 10 µm, and more preferably 0.05 to 5 µm. In particular, it is preferable to use particles having an average particle diameter of 0.05 to 0.5 µm, since the speed of the reductive reaction is accelerated.

If the silver oxide surface-treated silver particles are used, since organic matter around the particles is oxidized by oxygen emitted accompanying the reduction from silver oxide to silver, and heat is generated, then an effect of reducing the apparent baking temperature of the silver powder or the silver paste can be obtained. Therefore, the silver oxide content of the silver oxide surface-treated silver particles is preferably 1% by mass or more (silver content of 99% by mass or less), and particularly preferably 5% by mass or more (silver content of 95% by mass or less). Moreover, from the viewpoint of facilitating the fusion of silver particles, the particles desirably have a fixed amount of silver metal therein, and the silver oxide content is preferably 30% by mass or less (silver content of 70% by mass or more), and particularly preferably 20% by mass or less (silver content of 80% by mass or more). The preferable range of the silver oxide content of the silver oxide surface-treated silver particles is 1 to 30% by mass, and more preferably 5 to 20% by mass.

By applying the surface treatment method including vacuum freeze drying according to the present invention to these silver oxide-treated silver particles, a silver paste having a satisfactory conductivity and a low baking temperature can be obtained, and in addition particles having a high tendency to be reduced in a dry condition, can be stably preserved. Moreover, in the silver paste, the silver particles are stably dispersed in the form of fine particles (primary particles), and thus generation of unnecessary aggregates due to fusion of the particles at the time of reduction can be prevented, and problems in minute printing does not occur.

(Surfactant)

In the present invention, examples of the surfactant used for the surface treatment of silver or silver compound particles include surfactants of an alkylamine type or alkylamine salt type, and phosphate type surfactants having a phosphorus content of 0.5 to 10% by mass.

(Surfactant of Alkylamine Type or Alkylamine Salt Type)

As to the surfactant used in the present invention, alkylamine and alkylamine salt are suitably used. Sole usage of respective nonionic surfactants of an alkylamine type and a cationic surfactant of an alkylamine salt type is effective, although in particular, joint usage thereof further improves the dispersibility, and the effect is remarkable.

As to the surfactant of alkylamine type, surfactants of polyoxyalkylene alkylamine type are preferred, and surfactants of polyoxyethylene alkylamine type are more preferred. Among them, those having the following general formula (1) are further preferred.

[Chemical formula 1]

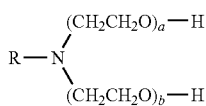
(1)

(wherein a and b are respectively integers of 1 to 20, and R represents an alkyl group or alkylaryl group having 8 to 20 carbon atoms.)

On the other hand, as to the surfactant of alkylamine salt type, alkylamine acetates are preferred. Among them, those having the following general formula (2) are further preferred.

[Chemical formula 2]

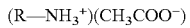
(2)

(wherein R represents an alkyl group or alkylaryl group having 8 to 20 carbon atoms.)

In the general formula (1) and the formula (2), the alkyl group having 8 to 20 carbon atoms may be a linear alkyl group or a branched alkyl group. Examples thereof include an octyl group, a nonyl group, a decyl group, an undecyl group, a dodecyl group, a lauryl group, a tetradecyl group, a myristyl group, a hexadecyl group, a cetyl group, an octadecyl group, a stearyl group, and an eicosyl group. Examples of the alkylaryl group having 8 to 20 carbon atoms include alkylphenyl groups such as an octylphenyl group, a nonylphenyl group, and a dodecylphenyl group. The alkyl part of the alkylaryl group may be a linear alkyl group or a branched alkyl group.

When a surfactant of an alkylamine type and a cationic surfactant of an alkylamine salt type are used either solely or in combination, the total blending quantity of the surfactants with respect to the silver or silver compound particles needs to be appropriately adjusted according to the type of the silver or silver compound particles. However, for example, it is preferably 0.01 to 3.00 parts by mass with respect to 100 parts by mass of silver or silver compound particles, and further preferably 0.05 to 1.50 parts by mass. If the total blending quantity of the surfactant is 0.01 parts by mass or more, a sufficient dispersibility is prone to be readily obtainable. On the other hand, if it is 3.00 parts by mass or less, the surface of the silver or silver compound particles is thinly coated with organic components of the surfactant, so that dried particles are readily brought into contact with each other, and thus the conductivity is prone to be improved.

If a surfactant of an alkylamine type and a cationic surfactant of an alkylamine salt type are used in combination, the blend ratio of the alkylamine type and alkylamine salt type is preferably within a range of 1:20 to 1:5.

(Phosphate Type Surfactant)

The phosphate type surfactant used in the present invention is a surfactant having a phosphate monoester or a phosphate diester as a main component, and those having a phosphorus content of 0.5 to 10% by mass are used. The phosphate type surfactant is preferably phosphate ester of polyoxyalkylene alkylether, and those having the chemical structure represented by the following general formula (3) are further preferred.

[Chemical formula 3]

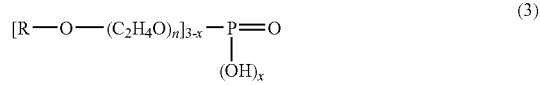
(3)

(In the formula (3), R represents an alkyl or alkylaryl group having 1 to 20 carbon atoms, n is an integer of 1 to 20, and x is an integer of 1 or 2.)

In the formula (3), the alkyl group having 1 to 20 carbon atoms may be a linear alkyl group or a branched alkyl group. Examples thereof include a methyl group, an ethyl group, a propyl group, an isopropyl group, a butyl group, a pentyl group, a hexyl group, a heptyl group, an octyl group, a nonyl group, a decyl group, an undecyl group, a dodecyl group, a lauryl group, a tetradecyl group, a myristyl group, a hexadecyl group, a cetyl group, an octadecyl group, a stearyl group, and an eicosyl group. Examples of the alkylaryl group having 20 or less carbon atoms include alkylphenyl groups such as an octylphenyl group, a nonylphenyl group, and a dodecylphenyl group. The alkyl part of the alkylaryl group may be a linear alkyl group or a branched alkyl group.

Preferably, the number of carbon atoms in R is 1 to 10, n is 1 to 10, and the sum of n and the number of carbon atoms in R is 7 to 15. The weight average molecular weight of the phosphate type surfactant is preferably 100 to 10000, and more preferably 150 to 5000. The content of P (phosphorus) is preferably 0.5 to 10% by mass, more preferably 1 to 7% by mass, particularly preferably 2 to 6% by mass, and yet more preferably 2 to 5% by mass.

Furthermore, as to the phosphate type surfactant used in the production method of the present invention, those having a HLB (hydrophile-lipophile balance) of 10 or more, or those in which a basic compound is added to neutralize the acid value, are preferably used.

The type and the blending quantity of the phosphate type surfactant can be appropriately selected according to the type of silver or silver compound particles. The blending quantity of the phosphate type surfactant needs to be appropriately adjusted according to the type of silver or silver compound particles. However, for example, it is preferably 0.01 to 3.00 parts by mass with respect to 100 parts by mass of silver or silver compound particles, and further preferably 0.05 to 0.50 parts by mass. If the surfactant is 0.01 parts by mass or more, a sufficient dispersibility is prone to be readily obtainable. On the other hand, if it is 3.00 parts by mass or less, the surface of the silver or silver compound particles is thinly coated with organic components of the surfactant, so that dried particles are readily brought into contact with each other, and thus the conductivity is prone to be improved.

(1) Dispersion Liquid Preparation Step

In the method for producing a surface-treated silver-containing powder of the present invention, firstly, a dispersion liquid is prepared in which silver or silver compound particles are dispersed in a dispersing solvent together with a surfactant of an alkylamine type or an alkylamine salt type, or a phosphate type surfactant having a phosphorus content of 0.5 to 10% by mass.

(Dispersing Solvent)

Here, the dispersing solvent (dispersion medium) used for dispersing the silver or silver compound particles is not specifically limited as long as it is suitable for dissolving the surfactant. Example thereof include: water; lower alcohol such as ethanol and isopropyl alcohol; and ethylene oxide-adduct of alkyl alcohol such as ethylene glycol hexylether, and diethylene glycol butylether, and propylene oxide-adduct of alkyl alcohol such as propylene glycol propylether. Among these dispersing solvents, water is preferred.

The dispersing solvent is not limited to those described herein. It may be solely used, or a plurality of types thereof may be used in combination (for example, as an aqueous solution or a mixed solvent).

(Preparation Method of Dispersion Liquid)

Examples of the preparation method of the dispersion liquid in which silver or silver compound particles are dispersed with the surfactant, include a method of adding the silver or silver compound particles and the surfactant into the dispersing solvent, followed by crushing of the silver or silver compound particles into fine particles (primary particles) and mixing with the surfactant by a stirrer or a disperser. In this case, the dispersion liquid of silver particles can be obtained by, for example, mixing the silver particles, the dispersing solvent, and the surfactant at a desired proportion, and dispersing the silver particles into the dispersing solvent while crushing them into primary particles by a disperser or the like, which is also the same in the case where silver compound particles or silver oxide-treated silver particles are used instead of the silver particles. When being added to the dispersing solvent, the silver or silver compound particles serving as the raw material are preferably formed into a silver or silver compound powder (dried powder) because of the advantages in that the usage amount of particles of silver and the like is readily optimized, and that undesirable components can be prevented from being contaminated therein from the raw material in the dispersion step.

The usable stirrer or disperser may be appropriately selected from publicly known stirrers or dispersers described later.

When the silver or silver compound powder is to be dispersed into a dispersing solvent, preferably, a surfactant is blended into the dispersing solvent and sufficiently dissolved therein, and then the silver or silver compound powder is blended thereinto. As required, the solubility of the surfactant into the dispersing solvent can be improved by neutralizing the surfactant (for example, in the case of a phosphate type surfactant, generating phosphate ester salt by using alkali or the like). When dispersed for 0.5 to 4.0 hours after blending, secondary particles (aggregated particles) in the silver powder or silver compound powder are crushed into primary particles, and the surfactant and the primary particles of the silver or silver compound come up to the adsorption equilibrium.

Moreover, as to another preparation method of the dispersion liquid, silver or silver compound particles (hereunder, these may be referred to as "particles of silver and the like") are synthesized in a liquid phase, and then the particles of silver and the like are filtrated from the mother liquid and washed, followed by dispersion in a dispersing solvent. In this method, it is desirable not to dry the particles of silver and the like, and it may be appropriately selected to have or not to have treatment such as filtration and washing.

Moreover, the solvent (such as water) of the mother liquid after the synthesis of the particles of silver and the like, can be directly used as the dispersing solvent in the dispersion liquid. In this case, the treatment for separating the particles of silver and the like from the mother liquid by means of filtration can be omitted. Moreover, in the case where unnecessary components coexist in the mother liquid, a treatment for removing the unnecessary components is performed, as required. Furthermore, after a necessary amount of surfactant is added into the dispersion liquid having the particles of silver and the like dispersed therein, the resultant product is subjected to a freeze drying treatment. If an appropriate surfactant is already added in the mother liquid, it may be utilized for the freeze drying treatment, or another surfactant may be further added thereinto.

According to this method, since the particles of silver and the like generated in the liquid phase are primary particles, the dispersion liquid having the particles of silver and the like dispersed together with the surfactant therein can be obtained, while preventing the particles of silver and the like from being aggregated. In this case, the treatment for crushing the secondary particles of silver and the like into primary particles using a stirrer or a disperser is unnecessary, and a desired dispersion state can be made in which the particles of silver and the like are dispersed in the dispersing solvent as primary particles, even if the degree of stirring and mixing is moderate.

The dispersion liquid of the particles of silver and the like containing a surfactant produced by the production method of a dispersion liquid exemplified above, is subjected to a freeze drying treatment in the next step. The range of the concentration of solid components of the particles of silver and the like in the dispersion liquid at the time of freeze drying, is preferably 0.5 to 80% by mass, and particularly preferably 1 to 50% by mass.

In the present invention, when a phosphate type surfactant is used, preferably, the resultant dispersion liquid has an acidic condition (for example, pH 1 to 3). When a surfactant of an alkylamine or alkylamine salt type is used, preferably, the dispersion liquid has an alkaline condition (for example, pH 12 to 14). As a result, an interfacial electric double layer is generated on the surface of the particles of silver and the like via the surfactant, and the dispersion stability is obtained. Moreover, since the phosphate type and the alkylamine or alkylamine salt type have opposite electric charges when their hydrophilic groups are ionized, preferably the surfactant is selected and used so that a repulsive force acts between the particles according to the sign of the surface charge of the particles of silver and the like.

For example, in the case of silver oxide surface-treated silver particles, a surfactant of an alkylamine or alkylamine salt type is preferred, and the silver paste made by this combination has merits of superior thixotropy and large filling amount. Moreover, in the case of pure silver particles (silver particles whose surface is not treated with silver oxide), a phosphate type surfactant is preferred, and the silver paste made by this combination has a merit of superior dispersibility in the binder resin.

(2) Drying Step

After the silver or silver compound particles are sufficiently dispersed in the dispersing solvent under the presence of the surfactant, the dispersing solvent is removed from the dispersion liquid by a vacuum freeze drying method.

In the production method of the present invention, since vacuum freeze drying is used as the drying method, a readily freezable solvent is preferably selected and used among the above solvents. In order to perform vacuum freeze drying, considering that the cooling ability of generally available devices is as low as about −40° C., it is preferable to select a solvent having a freezing point of −40° C. or higher as the dispersing solvent since the implementation cost can be reduced.

In the vacuum freeze drying method used in the production method of the present invention, basically, the dispersing solvent is solely sublimated and removed from the frozen dispersion liquid in a low temperature state. In this process, since the surfactant is not eluted nor lost into the dispersing solvent, almost all added surfactant remains in the treated silver or silver compound powder. As shown in FIG. 1, in the dispersion liquid, the surfactant (b) locally exists in the vicinity of the surface of the silver or silver compound particles (a). At the time of performing the vacuum freeze drying for solely removing the dispersing solvent, it is highly possible to take out the dispersing solvent in the state where the surfactants (b) are uniformly adsorbed on the surface of the silver or silver compound particles (a). Furthermore, at the time of removing the solvent, the silver or silver compound particles (a) and the surface-treated particles (c) are not aggregated with each other, unlike the case where the solvent is removed by a normal method other than vacuum freeze drying. Therefore, this method can be said to be a very effective treatment method. In this manner, all of the surfactants (b) used in the dispersion liquid remains on the surface of the silver or silver compound particles (a) even after the vacuum freeze drying, and the silver or silver compound particles (c) whose surface is treated with the surfactant (b) are provided with an excellent yield. Therefore, the relation between the effect and the usage amount of surfactant is readily understood. Moreover, since the optimization is readily performed with respect to the usage amount, the addition of the surfactant can be prevented from being excessive.

Molecules of the surfactant (b) are adsorbed on the surface of the silver or silver compound particles (a) at the terminal on the hydrophilic group side, and thus the terminal on the hydrophobic group side faces outward of the particle. As a result, the affinity with the binder resin is improved, and the dispersibility of the surface-treated silver or silver compound particles (c) is improved. Moreover, aggregation of particles can be suppressed, and the dispersed state in primary particles can be maintained.

For the vacuum freeze drying, for example, a method can be used in which the dispersion liquid is prefrozen to the freezing point of the dispersing solvent or lower at atmospheric pressure, and further the degree of vacuum is controlled at a pressure lower than the vapor pressure of the dispersing solvent at the freezing point. As a result, theoretically, the molecules of the dispersing solvent can be sublimated from the solid mixture in the frozen state.

For example, in the case of a dispersion liquid using water as a dispersing solvent (dispersion liquid containing silver or silver compound particles, water, and a surfactant), theoretically the degree of vacuum may be controlled so as not to exceed the water vapor pressure of 4.5 mmHg (=600 Pa) at 0° C., after prefreezing to 0° C. or less at atmospheric pressure. Taking into account the drying speed and the readiness of control, preferably the pressure is set to 1 mmHg (=133.32 Pa) or less, to increase the temperature to the melting point (freezing point) at this vapor pressure.

In this manner, in the drying method by means of vacuum freeze drying, since the particles are dried by sublimating and evaporating the dispersing solvent in a vacuum, shrinkage due to drying is little, and the organization and structure is hardly damaged. Moreover, unlike the hot air drying, liquid components such as water do not migrate due to drying in the sample at a high temperature, and drying is performed at a low temperature in the solid and frozen state. Thus, partial shrinkage of the component, partial change of the component, and deformation hardly occur, and therefore this method is preferable.

(3) Production of Silver Paste

In order to produce a conductive paste (silver paste) using a surface-treated silver-containing powder produced by the production method of the present invention, the surface-treated silver-containing powder (silver or silver compound powder), a solvent or a binder resin, and a solvent are mixed, and the silver or silver compound powder is dispersed using an appropriate disperser.

Examples of the solvent used in the production of a silver paste of the present invention, include: alcohols such as methanol, ethanol, n-propanol, benzyl alcohol, or Terpineol; ketones such as acetone, methylethylketone, cyclohexanone, isophorone, or acetylacetone; amides such as N,N-dimethylformamide or N,N-dimethylacetamide; ethers such as tetrahydrofuran, dioxane, methylcellosolve (trademark), diglyme, or butylcarbitol; esters such as methyl acetate, ethyl acetate, diethyl carbonate, TXIB (1-isopropyl-2,2-dimethyltrimethylenediisobutyrate), carbitol acetate, or butylcarbitol acetate; sulfoxides and sulfones such as dimethyl sulfoxide and sulfolane; aliphatic halogenated hydrocarbon such as methylene chloride, chloroform, carbon tetrachloride, or 1,1,2-trichloroethane; and aromatic series such as benzene, toluene, o-xylene, p-xylene, m-xylene, monochlorobenzene, or dichlorobenzene.

The solvent is not limited to those described herein. It may be solely used, or a plurality of types thereof may be used in combination.

The silver or silver compound powder whose surface is treated by the method of the present invention may be used in the dispersed state in the abovementioned solvent as a silver paste to be coated onto the base material. However, preferably, a binder resin is further added therein so as to improve the dispersion stability of the silver or silver compound, and to improve the adhesiveness to the base material, for use as a silver paste.

Examples of the binder resin that can be used for the silver paste of the present invention include an acrylic resin, a butylal resin, a polyvinyl alcohol resin, an acetal resin, a phenol resin, a urea resin, a vinyl acetate emulsion, a polyurethane resin, a polyester resin, a polyvinyl acetate resin, an epoxy resin, a melamine resin, an alkyd resin, a nitrocellulose resin, and a natural resin, which may be solely used, or a plurality of types thereof may be used in combination.

The usage amount of the binder resin is preferably within a range of 0.01 to 30 parts by mass per 100 parts by mass of surface-treated silver-containing powder, and particularly preferably a range of 0.01 to 10 parts by mass.

Moreover, the usage amount of the solvent differs depending on the coating method and the printing method, and may be appropriately selected.

If the surface-treated silver-containing powder of the present invention is used as a raw material, when a silver paste is needed, the silver paste can be quickly produced merely by performing a simple dispersion treatment such as stirring using a solvent, or a solvent with a binder resin. That is, since a satisfactory silver paste can be obtained merely by performing a simple stirring operation using an entrainer, or an entrainer with an additional binder immediately before printing, then not a lot of accessory equipment is required for paste preparation in the printing device. However, in order to more reliably perform the dispersion, dispersion treatment may be performed using the following dispersion devices.

Examples of usable dispersion devices include a twin-roll mill, a triple-roll mill, a ball mill, a sand mill, a pebble mill, a tron mill, a sand grinder, a Szegvari attritor (trademark), a high-speed impeller disperser, a high-speed stone mill, a high-speed impact mill, a kneader, a homogenizer, and an ultrasonic disperser. By using them, kneading and dispersion can be performed.

The kneaded and dispersed silver paste can be printed as a composition in a paste form onto an insulative film or an insulative substrate, generally by a publicly known and commonly used coating method or printing method, which is then heated, so as to form the conductive circuit.

The silver paste of the present invention is capable of forming coatings by various coating methods. Coatings can be formed on substrates by, for example, publicly known roll coating methods, specifically air doctor coating, blade coating, rod coating, extrusion coating, air knife coating, squeeze coating, impregnation coating, reverse roll coating, transfer roll coating, gravure coating, kiss coating, cast coating, and spray coating. Moreover, various printing methods can be applied, too. The printing methods include those in which the optimum viscosity region is in a relatively low viscosity region such as intaglio printing, and those in which the optimum viscosity region is in a high viscosity region such as screen printing. Specifically, coatings can be printed on substrates in a predetermined size, using a stencil printing method, an intaglio printing method, a lithography method, or the like.

Examples of the material of the substrates at the time of coating or printing include a polyethylene terephthalate film (PET film), a polyimide film (PI film), and a green sheet (inorganic substrate). The silver paste may be printed on these films in a predetermined pattern, and after the printed matter is dried, a heating and curing treatment may be performed thereon.

Moreover, the thickness of the printed matter differs depending on the printing method. However, the thickness of the printed matter at the time of drying is preferably within a range of 1 to 30 μm, and particularly preferably 1 to 15 μm. After the printed matter is dried, in order to increase the electrical resistance per unit volume (volume resistivity), pressing or calendering treatment may be performed to a degree not to cause significant deformation of the substrate.

The coating obtained in this manner is dried, for example, at about 160° C. for about 5 minutes, followed by a heat treatment step at about 250° C. to cure the binder resin. As a result, conductive circuits for various electronic circuit substrates can be obtained.

In particular, if silver oxide fine particles, or silver oxide surface-treated silver particles are used as silver or silver compound particles, reduction is performed from silver oxide into silver by the above heat treatment together with curing, and the surrounding surfactant and resin are oxidized by oxygen emitted accompanying the reductive reaction, and thereby heat can be generated. As a result, the silver particles in which the silver oxide is reduced can be fused with each other by a heat treatment at a lower temperature (such as 160 to 200° C.), compared to the case where pure silver particles are used. Consequently, in the silver paste using oxidized silver particles or silver oxide-treated silver particles, the requirement for heat resistance of the material of the substrates at the time of coating or printing can be reduced, and thus it is particularly suitable for substrates formed from PET, PI, and other plastics.

Figure 2:
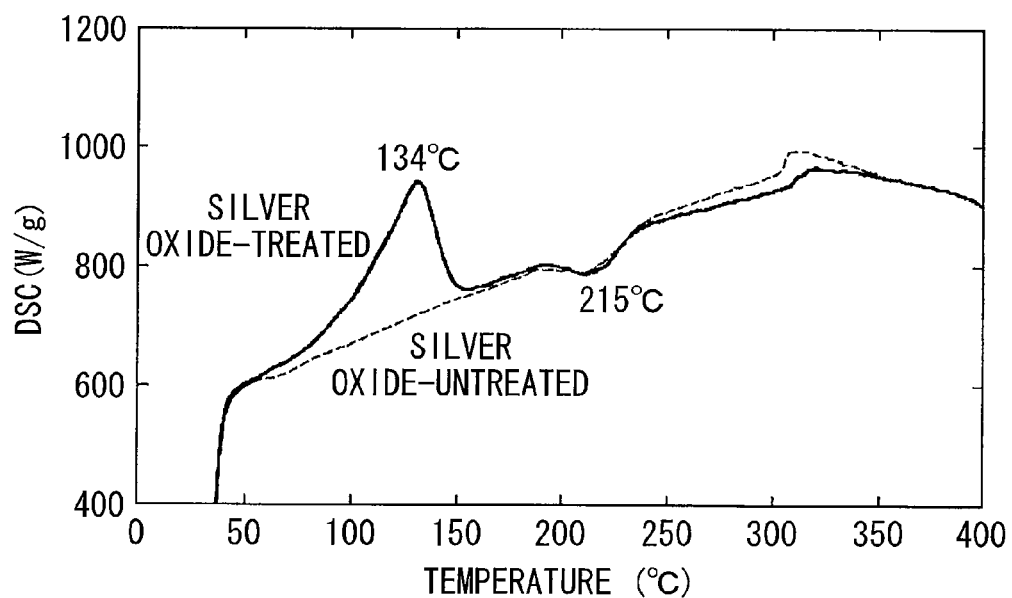
FIG. 2 is a graph showing an example of measurement result of DSC analysis of a silver powder after the surface treatment according to the present invention.

FIG. 2 shows the results of differential thermal analysis (DSC analysis) of a silver powder after surface treatment with a surfactant produced by using a low-temperature sintering silver powder (silver powder having a small crystallite diameter), and a silver powder after surface treatment with a surfactant produced by using a silver oxide-treated low-temperature sintering silver powder (silver oxide-treated silver powder having a small crystallite diameter).

In the result of the DSC analysis of the silver powder after the surface treatment of the present invention produced by using the silver powder having a small crystallite diameter (shown by the broken line in FIG. 2), an endothermic peak showing the melting of the silver powder appeared at 215° C. This shows that melting occurs at a lower temperature than that of the conventional case because the crystallite diameter of the silver powder is small.

Moreover, in the result of the DSC analysis of the silver powder after the surface treatment of the present invention produced by using the silver oxide-treated silver powder (shown by the solid line in FIG. 2), an endothermic peak showing the melting of the silver powder appeared at 215° C., and an exothermic peak appeared at 134° C. This exothermic peak is considered to be caused by an emission of oxygen due to decomposition of the silver oxide in the silver powder, followed by an occurrence of an exothermic reaction due to oxidization of the carbon component of the surfactant on the surface.

As is apparent from the above result, according to the surface-treated silver powder of the present invention, a silver paste bakable at a lower temperature than that of the conventional case can be produced.

EXAMPLES

Hereunder is a more specific description of the present invention with reference to Examples; however, the present invention is not limited to the scope of these Examples. The measuring methods of the physical properties are as follows.

(1) Film thickness: the film thickness was measured using a thickness tester K402B (manufactured by Anritsu Corp.).

(2) Volume resistivity: the volume resistivity was measured by a low resistivity meter Rolester EP (manufactured by Mitsubishi Chemical Co., Ltd.) of the four-terminal measuring method. The volume resistivity was obtained from the film thickness of the conductive film of the test piece. The volume resistivity is shown in a description method where, for example, $8.8 \times 10^{-6} \Omega \cdot cm$ is expressed as "8.8E-06Ω·cm".

The surfactants A and B used in the present Examples are as follows.

(Surfactant A)

A surfactant Disperbyk-111 (manufactured by BYK-Chemie Japan KK) having a phosphate monoester having a P (phosphorus) content of 2.7% by mass as the main component and a weight average molecular weight of 2800, was used. This surfactant was neutralized by potassium hydroxide of an amount capable of completely neutralizing the acid component, and then 10% by mass aqueous solution of surfactant was formed.

(Surfactant B)

A surfactant of polyoxyalkylene alkylether/phosphate ester having a P (phosphorus) content of 4.4% by mass, a weight average molecular weight of 1750, and a HLB of 12, was used. This surfactant was neutralized by potassium hydroxide of an amount capable of completely neutralizing the acid component, and then 10% by mass aqueous solution of surfactant was formed.

(Surfactant C)

5 g of 10% by mass aqueous solution of coconut amine acetate as a cationic surfactant of alkylamine salt, and 0.5 g of 10% by mass aqueous solution of polyoxyethylene coconut alkylamine ether as a surfactant of alkylamine, were mixed at this weight ratio and used.

Example 1

50 g of silver powder FHD (manufactured by Mitsui Mining & Smelting Co., Ltd.) having a mean particle diameter of 0.3 μm (crystallite diameter<10 nm), 2.5 g of 10% by mass aqueous solution of the surfactant A as a surfactant, 50 g of water as a solvent, and 400 g of zirconia beads having a diameter of 2 mm, were placed and mixed in a 250 cc plastic bottle, and then milled using a rotator (ball mill) for 4 hours, so as to obtain a silver powder dispersion liquid (a1).

Figure 3:
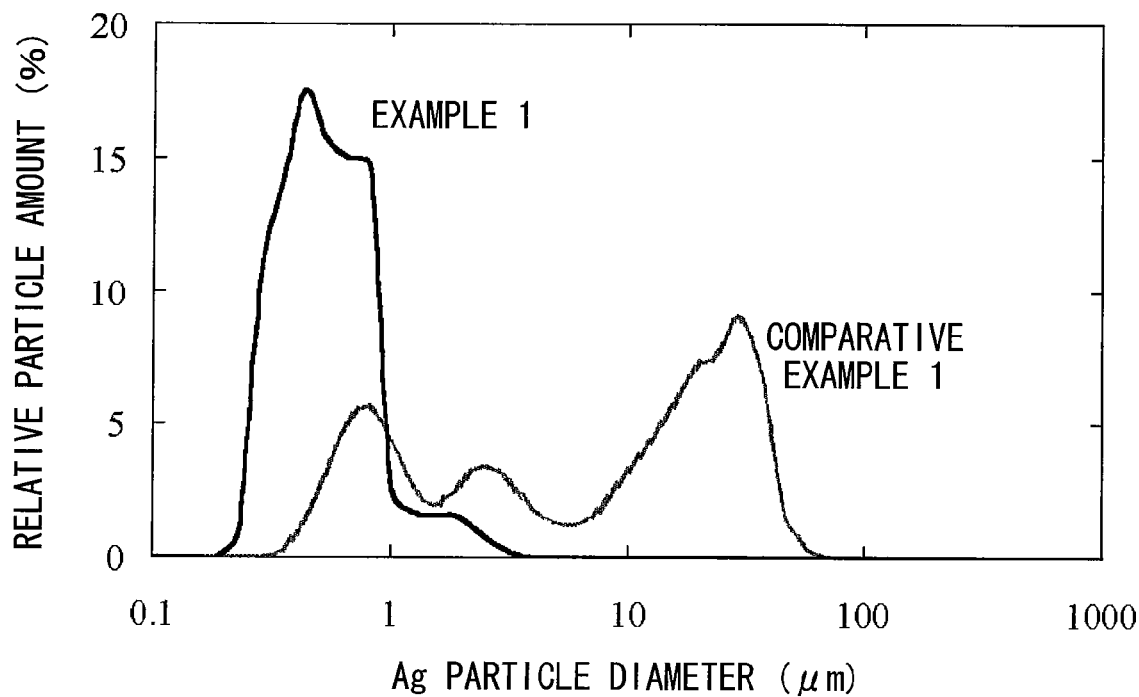
FIG. 3 is a graph showing the particle size distribution of surface-treated silver powders produced in Example 1 and Comparative Example 1, in volume basis.

100 g of this silver powder dispersion liquid (a1) was transferred into a flat tray having a bottom dimension of 200 mL×150 mmW, and subjected to prefreeze-drying, followed by vacuum freeze drying. For the vacuum freeze dryer, a "DFM-05AS" (manufactured by ULVAC, Inc.) was used. The prefrozen silver powder dispersion liquid (a1) was placed on a shelf that had been previously chilled at about −40° C., and subjected to vacuum freeze drying at a degree of vacuum of 7 to 10 Pa for 20 hours. Then, 50 g of surface-treated silver powder (b1) was obtained as a bulky sponge-like dry matter. FIG. 3 shows the particle size distribution of the silver particles at this time, in volume basis. The volume average particle diameter was 0.6 μm. Next, 50 g of the surface-treated silver powder (b1), 5.6 g (solid component=2.5 g) of acrylic resin "#15-78" (manufactured by Toeikasei Co., Ltd.) as a binder resin, and 2.7 g of carbitol acetate were placed and mixed in a 250 cc plastic bottle, and then mixed and stirred using a shaker (paint conditioner) for 0.5 hours, so as to obtain a silver paste B-1. The silver paste was stable without causing a viscosity rise over time nor aggregation. A print pattern having a size of 50 mm×80 mm with a line width of 50 μm was formed on a PI film by using this paste B-1, to obtain a screen printed coating film having a thickness of 10 μm. This printed coating film was dried at 150° C. for 5 minutes, and then was placed in an oven at 160° C. and 250° C. for 60 minutes so as to be baked. The printing condition was observed with a microscope, showing that a satisfactory conductive circuit pattern without defects was formed. Furthermore, solid printing having a thickness of 50 μm was performed. Then, drying and baking were performed in the same manner. The volume resistivity of the resultant dry coating film was measured.

Figure 4:
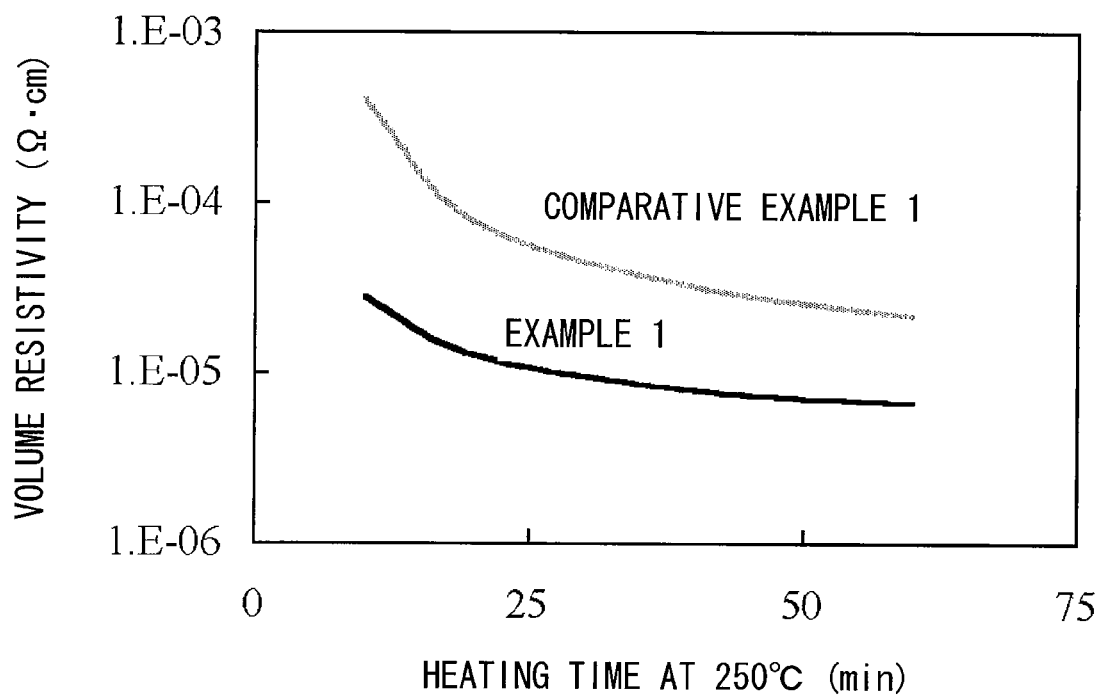
FIG. 4 is a graph showing the measurement result of resistivity of dry coating film of the conductive pastes produced in Example 1 and Comparative Example 1, with variations in the baking time at 250° C.

After drying, and after placing in the oven at 160° C. and 250° C. for 60 minutes, the volume resistivity showed respectively 2.9E-03Ω·cm and 6.7E-06Ω·cm. Moreover, the volume resistivity of the dry coating film was decreased with time in the oven. FIG. 4 shows the decrease in the volume resistivity when the oven temperature was 250° C.

Example 2

In the same manner as that of Example 1 except for that the surfactant of Example 1 was changed into a surfactant B, 105 g of silver powder dispersion liquid (a2) and 50 g of surface-treated silver powder (b2) were obtained. The volume average particle diameter of this surface-treated matter was 0.6 μm, and a similar particle diameter distribution to that of Example 1 was shown.

Next, in the same manner as that of Example 1, 58.3 g of silver paste B-2 was obtained. The silver paste was stable without causing a viscosity rise over time nor aggregation. In the same manner as that of Example 1, using a mask film formed with a print pattern of a conductive circuit of a line width of 50 μm, screen printing was performed, to obtain a printed coating film. Furthermore, solid printing having a thickness of 50 μm was performed in the same manner as that of Example 1. After drying, and after placing in the oven at 160° C. and 250° C. for 60 minutes, the volume resistivity was measured, which showed respectively 1.7E-02Ω·cm and 1.5E-05Ω·cm.

Example 3

In the same manner as that of Example 2 except for that the silver powder FHD of Example 2 was changed into a silver powder AgC-G (manufactured by Fukuda Metal Foil & Powder Co., Ltd.), 105 g of silver powder dispersion liquid (a3) and 50 g of surface-treated silver powder (b3) were obtained. The volume average particle diameter of the silver particles at this time was 0.2 μm, and a particle size distribution having a narrow distribution width was shown.

Next, in the same manner as that of Example 1, 58.3 g of silver paste B-3 was obtained. The silver paste was stable without causing a viscosity rise over time nor aggregation. In the same manner as that of Example 1, using a mask film formed with a print pattern, screen printing was performed, to obtain a printed coating film. Furthermore, solid printing having a thickness of 50 μm was performed in the same manner as that of Example 1. After drying, and after placing in the oven at 160° C. and 250° C. for 60 minutes, the volume resistivity was measured, which showed respectively 4.5E-05Ω·cm and 2.5E-05Ω·cm.

Example 4

Figure 5:
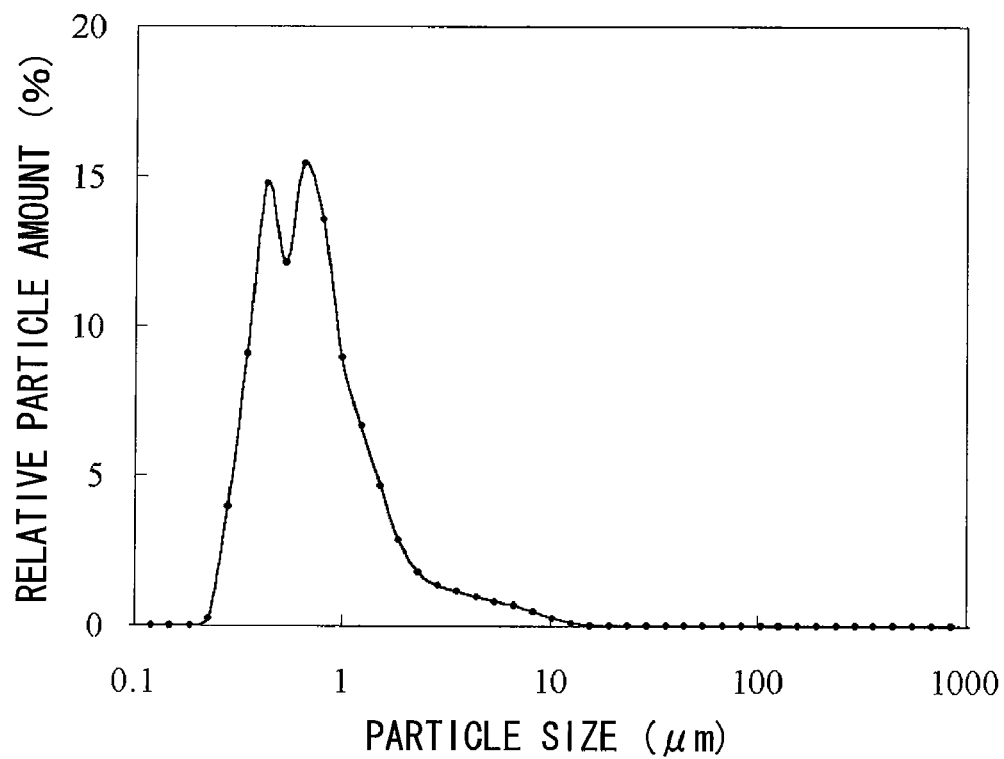
FIG. 5 is a graph showing the particle size distribution of a surface-treated silver powder produced in Example 4, in volume basis.

In the same manner as that of Example 2 except for that the silver powder FHD of Example 2 was changed into a silver powder $Ag_2O$.FHD whose surface was treated with 10% silver oxide, 105 g of silver powder dispersion liquid (a4) and 50 g of surface-treated silver powder (b4) were obtained. FIG. 5 shows the particle size distribution of the silver particles at this time, in volume basis. The volume average particle diameter was 0.7 μm, and a particle size distribution having a narrow distribution width was shown.

Next, in the same manner as that of Example 1, 58.3 g of silver paste B-4 was obtained. The silver paste was stable without causing a viscosity rise over time. In the same manner as that of Example 1, using a mask film formed with a print pattern, screen printing was performed, to obtain a printed coating film. Furthermore, solid printing having a thickness of 50 μm was performed in the same manner as that of Example 1. This printed coating film was dried at 150° C. for 5 minutes. Then, in the oven at 160° C. and 250° C., the volume resistivity of the dry coating film was measured.

After drying, and after placing in the oven at 160° C. and 250° C. for 60 minutes, the volume resistivity showed respectively 9.8E-05Ω·cm and 1.5E-05Ω·cm.

Example 5

50 g of silver powder FHD (manufactured by Mitsui Mining & Smelting Co., Ltd.) having a mean particle diameter of 0.3 μm (crystallite diameter<10 nm) which was treated with 10% silver oxide, the surfactant C (5 g of 10% by mass aqueous solution of coconut amine acetate as a cationic surfactant of alkylamine salt, and 0.5 g of 10% by mass aqueous solution of polyoxyethylene coconut alkylamine ether as an alkylamine surfactant), 50 g of water as a solvent, and 400 g of zirconia beads having a diameter of 2 mm, were placed and mixed in a 250 cc plastic bottle, and then milled using a rotator (ball mill) for 4 hours, so as to obtain a silver paste (a5).

Figure 6:
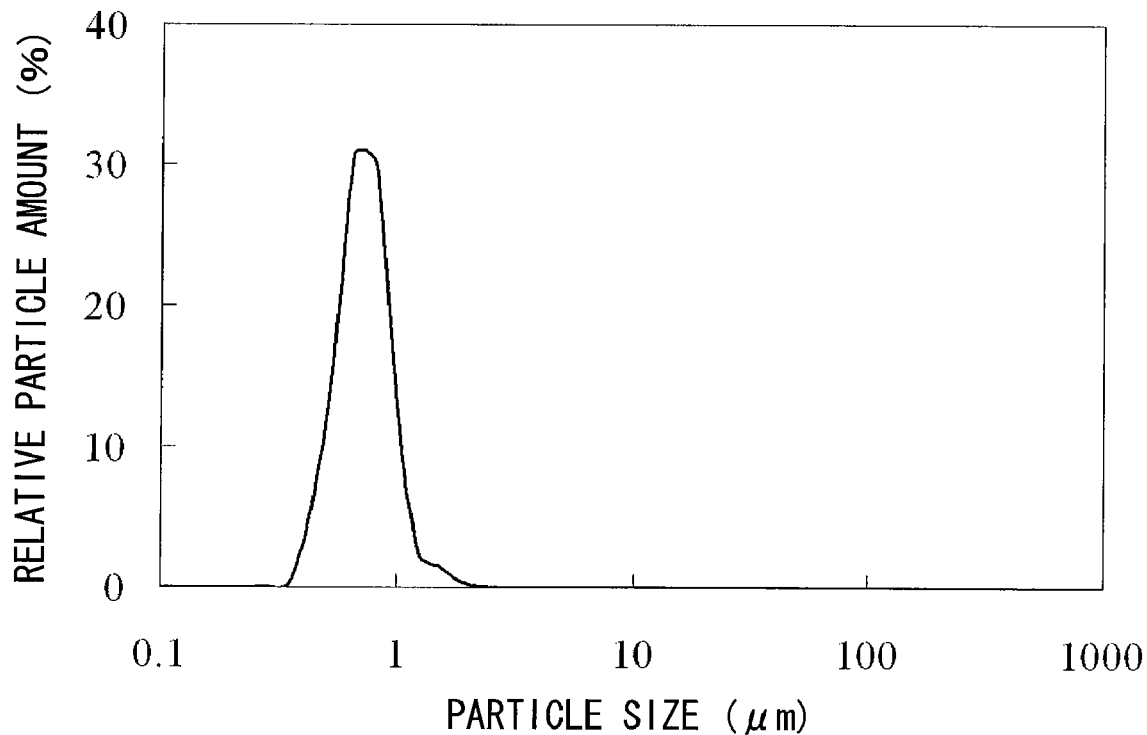
FIG. 6 is a graph showing the particle size distribution of a surface-treated silver powder produced in Example 5.

100 g of this silver powder dispersion liquid (a5) was transferred into a flat tray having a bottom dimension of 200 mL×150 mmW, and subjected to prefreeze-drying, followed by vacuum freeze drying. For the vacuum freeze dryer, "DFM-05AS" (manufactured by ULVAC Inc.) was used. The prefrozen silver powder dispersion liquid (a5) was placed on a shelf that had been previously chilled at about −40° C., and subjected to vacuum freeze drying at a degree of vacuum of 7 to 10 Pa for 20 hours. Then, 50 g of surface-treated silver powder (b5) was obtained as a bulky sponge-like dry matter. FIG. 6 shows the particle size distribution of the surface-treated silver particles at this time.

Figure 7:
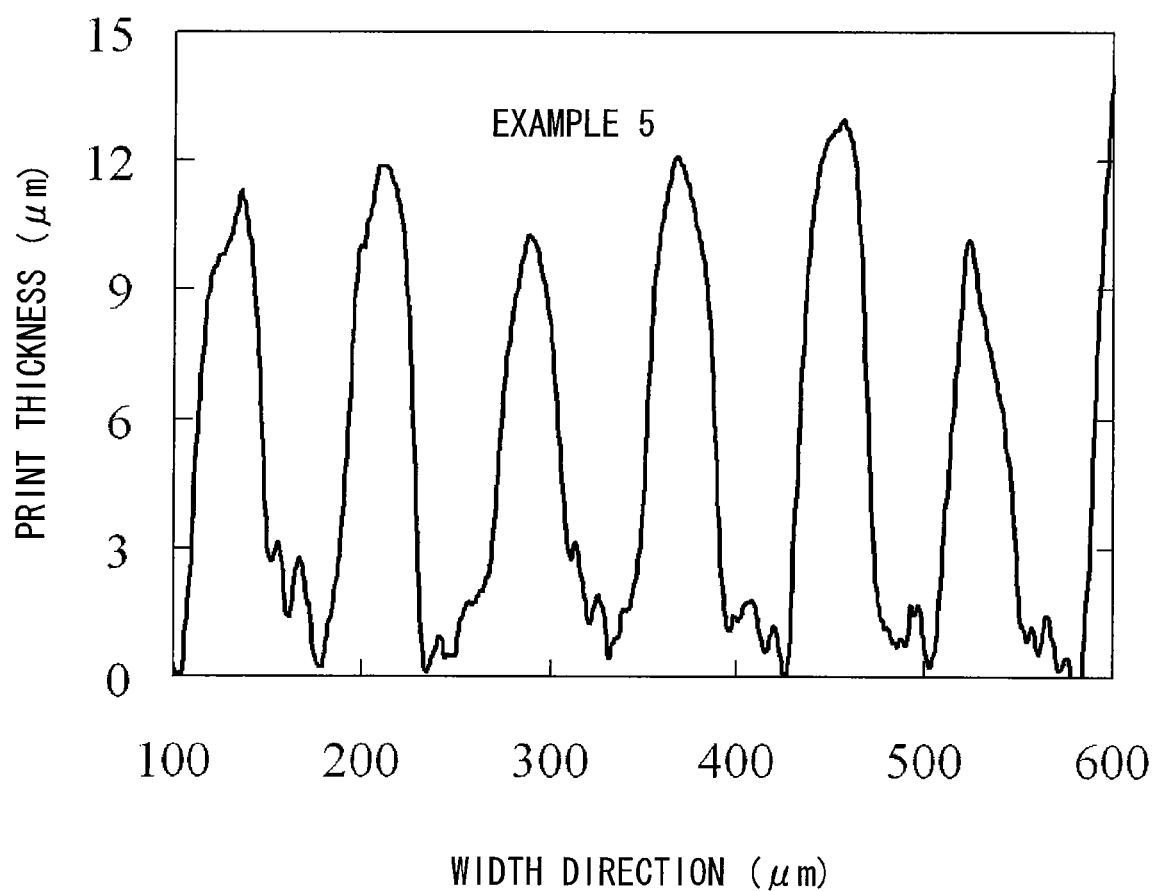
FIG. 7 is a graph showing the profile of a thin line pattern produced by screen printing using a silver paste produced in Example 5.

Next, 50 g of the surface-treated silver powder (b5), 4.17 g (solid component=2.5 g) of binder resin, in which the solvent component of a mixture of "BARNOC DB980K" (manufactured by Dainippon Ink and Chemicals, Inc.) as an isocyanurate prepolymer component and "BARNOC DE-140-70" (manufactured by Dainippon Ink and Chemicals, Inc.) and "BARNOC DB980" (manufactured by Dainippon Ink and Chemicals, Inc.) as a polyol component, was substituted with carbitol acetate, and 4.2 g of carbitol acetate were placed and mixed in a 250 cc plastic bottle, and then mixed and stirred using a shaker (paint conditioner) for 0.5 hours, so as to obtain a silver paste B-5. A rectangular print pattern of 50 mm×80 mm having a Line/Space=40 μm/40 μm was formed on a PI film by using this silver paste B-5, to obtain a screen printed coating film. The average thickness of the rectangular printed coating film was 12 μm. Meanwhile, the thickness distribution of the print pattern was measured with a laser microscope (VK-9500 manufactured by Keyence Corporation.). FIG. 7 shows its profile. Here, the specification of the screen substrate was 640 mesh, a line diameter of 15 μm, a calender thickness of 22 μm, and a emulsion thickness of 10 μm. The average value of the peak height of the print pattern was 11.9 μm.

Figure 8:
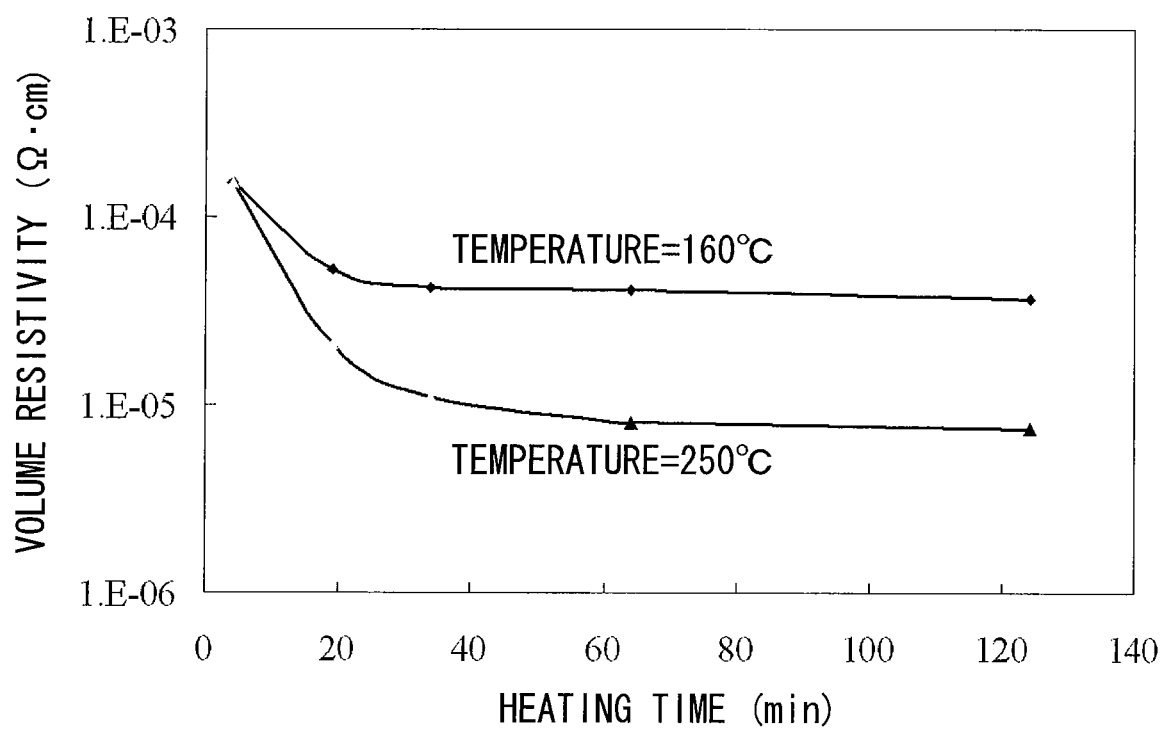
FIG. 8 is a graph showing the relation between the heating time (baking time) and the volume resistivity of a thin line pattern, when the thin line pattern produced by the silver paste of Example 5 is baked at 160° C. or 250° C.

The rectangular printed coating film was dried at 150° C. for 5 minutes. After drying, and after placing in the oven at 160° C. and 250° C. for 60 minutes, the volume resistivity was measured, which showed respectively 3.7E-05Ω·cm and 7.5E-06Ω·cm. The volume resistivity of the dry coating film was decreased with time in the oven. FIG. 8 shows the decrease in the volume resistivity when the oven temperature was 160° C. and 250° C.

Comparative Example 1

In the same manner as that of Example 1 except for that, instead of the surfactant of Example 1, 0.5 g of an acrylic surfactant Disperbyk-2001 (manufactured by BYK-Chemie Japan KK) having phosphate diester having a P content of 0.4% by mass as a component and a weight average molecular weight of 2500 was used, 105 g of silver powder dispersion liquid (a6) and 50 g of surface-treated silver powder (b6) were obtained. FIG. 3 shows the particle diameter distribution of this surface-treated matter, in volume basis. Next, in the same manner as that of Example 1, using a mask film formed with a print pattern using the silver paste B6, screen printing was performed. Then, the mask was partially clogged, and thin lines were not able to be printed. Furthermore, solid printing having a thickness of 50 μm was performed in the same manner as that of Example 1. This printed coating film was dried at 150° C. for 5 minutes. Then, after placing in the oven at 160° C. and 250° C. for 60 minutes, the volume resistivity of the dry coating film was measured.

After drying, and after placing in the oven at 160° C. and 250° C. for 60 minutes, the volume resistivity showed respectively 2.5E+01Ω·cm and 2.2E-05Ω·cm. Moreover, the volume resistivity of the dry coating film was decreased with time in the oven. FIG. 4 shows the decrease in the volume resistivity when the oven temperature was 250° C.

Comparative Example 2

In the same manner as that of Example 1 except for that, instead of the surfactant of Example 1, 0.5 g of Hitenol NF13 (manufactured by DAI-ICHI KOGYO SEIYAKU CO., LTD.) was used as a high purity emulsifying dispersant, 105 g of silver powder dispersion liquid (a6) and 50 g of surface-treated silver powder (b6) were obtained. The volume average particle diameter of this surface-treated matter was 1.5 μm, and a particle diameter distribution having a maximum particle diameter of 35 μm was shown. Next, in the same manner as that of Example 1, using a mask film formed with a print pattern using the silver paste B6, screen printing was performed. Then, the mask was partially clogged, and thin lines were not able to be printed.

Comparative Example 3

In the same manner as that of Example 1 except for that, instead of the surfactant of Example 1, 0.5 g of Poise 520 (manufactured by Kao Corporation,) was used as a particular carboxylic acid-type polymeric surfactant, 105 g of silver powder dispersion liquid (a7) and 50 g of surface-treated silver powder (b7) were obtained. The average volume particle diameter of this surface-treated matter was 0.9 μm, and a particle diameter distribution having a maximum particle diameter of 24 μm was shown. Next, in the same manner as that of Example 1, using a mask film formed with a print pattern using the silver paste B7, screen printing was performed. Then, the mask was partially clogged and thin lines were not able to be printed.

Table 1 is a summary of silver powders and surfactants used in the Examples and Comparative Examples as described above. Furthermore, Table 2 is a summary of values of volume resistivity after baking respectively at 160° C. and 250° C. for 60 minutes, the screen printing precision, and the screen printing suitability.

Here, the screen printing precision and the screen printing suitability were evaluated by the following criteria.

(Screen Printing Precision)

Whether or not a conductive circuit pattern of a line width of 50 μm was printable without any missing part by screen printing, was judged as G or NG.

(Screen Printing Suitability)

Whether or not printing without clogging was feasible by means of screen printing using a 400 mesh screen having a line diameter of 18 μm, was judged as G or NG.

TABLE 1

|  | Silver powder used | Surfactant used |
|---|---|---|
| Example 1 | FHD | A |
| Example 2 | FHD | B |
| Example 3 | AgC-G | B |
| Example 4 | silver oxide surface-treated FHD | B |
| Example 5 | silver oxide surface-treated FHD | C |
| Comparative Example 1 | FHD | Disperbyk-2001 |
| Comparative Example 2 | FHD | Hitenol NF |
| Comparative Example 3 | FHD | Poise 520 |

TABLE 2

| | Volume resistivity after baking($\Omega \cdot$ cm) | | | |
|---|---|---|---|---|
| | Baking Temperature 160° C. | Baking Temperature 250° C. | Screen printing precision | Screen printing suitability |
| Example 1 | 2.9E−03 | 6.7E−06 | G | G |
| Example 2 | 1.7E−02 | 1.5E−05 | G | G |
| Example 3 | 4.5E−05 | 2.5E−05 | G | G |
| Example 4 | 9.8E−05 | 1.5E−05 | G | G |
| Example 5 | 3.7E−05 | 7.5E−06 | G | G |
| Comparative Example 1 | 2.5E+01 | 2.2E−05 | NG | NG |
| Comparative Example 2 | — | — | NG | NG |
| Comparative Example 3 | — | — | NG | NG |

As shown from Table 1 and Table 2, when a conductive paste (silver paste) is produced using a phosphate type surfactant having a phosphorus content of 0.5 to 10% by mass, or a surfactant mixture of an alkylamine type and an alkylamine salt type, a conductive paste having a satisfactory dispersibility without causing clogging in a mask for printing thin lines of 30 μm, was produced. Moreover, as being apparent from the relation between the volume resistivity and the degree of dispersibility of the silver particles in a silver paste shown in Table 2, FIG. 3, and FIG. 4, regarding the dispersion state of the silver paste, it is understood that the closest packing was readily obtained and the conductivity was higher in the dispersed one than the aggregated one.

Furthermore, it is understood that, when a silver oxide surface-treated silver powder was used for the conductive paste, a satisfactory conductivity was realizable by forming a wiring pattern by means of low-temperature baking using a silver powder having a small particle diameter.

INDUSTRIAL APPLICABILITY

According to the present invention, a silver paste in which silver or silver compound particles having a fine particle diameter are satisfactorily dispersed, which is not changed in physical properties over time such as viscosity rise, and is capable of forming a conductive circuit having a satisfactory conductivity with a thin line width, can be provided. Therefore, the present invention is industrially useful.

The invention claimed is:

1. A method for producing a surface-treated silver-containing powder comprising:
   vacuum freeze drying a dispersion liquid, which is obtained by dispersing silver or silver compound particles in a dispersing solvent together with a surfactant of an alkylamine type or alkylamine salt type, or a phosphate type surfactant having a phosphorus content of 0.5 to 10% by mass; and
   synthesizing the silver or silver compound particles in a liquid phase,
   taking out the synthesized particles by means of filtration,
   dispersing the taken out particles into the dispersing solvent before the particles get dried, and then
   adding the surfactant into the dispersion liquid, in order to prepare the dispersion liquid.

2. A method for producing a surface-treated silver-containing powder according to claim 1, wherein a volume average particle diameter of said silver or silver compound particles is within a range of 0.05 to 10 μm.

3. A method for producing a surface-treated silver-containing powder comprising:
   vacuum freeze drying a dispersion liquid, which is obtained by dispersing silver or silver compound particles in a dispersing solvent together with
   a surfactant of an alkylamine type or alkylamine salt type, or
   a phosphate type surfactant having a phosphorus content of 0.5 to 10% by mass, wherein
   said silver or silver compound particles are silver particles whose surface is coated with silver oxide, and the silver oxide content is 1 to 30% by mass, and
   a volume average particle diameter of the silver of silver compound particles is within a range of 0.05 to 10 μm.

4. A method for producing a surface-treated silver-containing powder comprising
   vacuum freeze drying a dispersion liquid, which is obtained by dispersing silver or silver compound particles in a dispersing solvent together with a surfactant of a phosphate type surfactant having a phosphorus content of 0.5 to 10% by mass; and
   synthesizing the silver or silver compound particles in a liquid phase,
   directly using a solvent of a mother liquid that is used for a synthesis of the silver or silver compound particles as the dispersing solvent in the dispersion liquid that includes the silver or silver compound particles, and then
   adding the surfactant into the dispersion liquid, in order to prepare the dispersion liquid.

* * * * *